United States Patent [19]

Bock

[11] 4,421,266
[45] Dec. 20, 1983

[54] HANDLING BODIES CONTAINING BONDING MATERIAL

[75] Inventor: Anne B. Bock, Kutztown, Pa.

[73] Assignee: Western Electric Company, Inc., New York, N.Y.

[21] Appl. No.: 287,971

[22] Filed: Jul. 29, 1981

[51] Int. Cl.³ .......................... B23K 1/12; H05K 1/04
[52] U.S. Cl. ............................... 228/180 A; 228/6 A; 29/843
[58] Field of Search ............... 228/6 A, 180 A, 245, 228/246; 156/247, 249, 344; 118/502; 294/61; 29/840, 843

[56] References Cited

U.S. PATENT DOCUMENTS

| 245,410 | 8/1881 | Sheldon . | |
|---|---|---|---|
| 1,523,633 | 1/1925 | Cousar et al. | 294/61 |
| 2,125,112 | 7/1938 | Ingham | 294/61 |
| 2,204,496 | 6/1940 | Hogue | 294/61 |
| 2,220,741 | 11/1940 | Thorson . | |
| 2,645,006 | 7/1953 | Hadley . | |
| 3,320,658 | 5/1967 | Bolda et al. | 228/246 X |
| 3,694,614 | 9/1972 | Bihler | 219/103 |
| 4,132,341 | 1/1979 | Bratschum | 228/180 A |

Primary Examiner—Nicholas P. Godici
Assistant Examiner—M. Jordan
Attorney, Agent, or Firm—D. C. Watson

[57] ABSTRACT

Bodies (22) containing bonding material are applied in a substantially simultaneous manner to each of an array of bonding sites (18). A member (50) holds the bodies (22) in an array corresponding to the array of bonding sites (18). A pickup head (40) holds an array of pickup pins (42) such that pickup ends thereof correspond to the array of bodies (22) and sites (18). A mechanism (31) manipulates the head (40) and the array of pins (42) in steps, to substantially simultaneously engage each of the bodies (22) in the member (50) with a corresponding pickup end of a pin (42), to substantially simultaneously contact each of the bodies (22) to a corresponding bonding site (18) and to substantially simultaneously disengage the pins (42) from the bodies (22). In a preferred embodiment, the bodies (22) contain solder which is readily conductive and frictionally engageable by pressure of the pins (42) upon the bodies (22).

17 Claims, 9 Drawing Figures

HANDLING BODIES CONTAINING BONDING MATERIAL

TECHNICAL FIELD

This invention relates to handling deformable bodies; and more particularly, to substantially simultaneously applying respective ones of bodies containing bonding material to each of an array of bonding sites.

BACKGROUND OF THE INVENTION

In the assembly of electronic devices, integrated circuit chips are often enclosed in a package having a plurality of terminals for connection to the outside world. The industry seems to be trending toward an ever increasing number of such terminals while the packages are being kept as small as possible to conserve space in service. Consequently, external terminals are becoming more densely arranged and adapting them for connection has become a significant problem.

In a typical chip carrier, the terminals are arranged in four rows extending along four edges of a square surface. The terminals are usually flat metal pads which are later bonded to a corresponding array of terminal pads or flat leads on a ceramic or Printed Circuit (P-C) board. To prepare for such bonding, it is customary to fuse a preformed body of bonding material to each terminal of a carrier. Later, when the carrier is to be bonded to the board, the array of such bodies of material are simultaneously heated and reflowed to form conductive connections between carrier terminals and board terminals.

Heretofore, preformed bodies of bonding material have been manipulated by various expedients depending upon their size and shape and the number to be applied in a given cycle. For I.C. chip carriers, tiny spheres are selected for economy, and arrays of 20-48 spheres have been simultaneously applied in the past, often engaged by an array of vacuum cups. A problem is that the cups do not readily retain spheres which may be irregular in shape and vacuum tends to draw flux from the bonding sites.

Consequently, it is desirable to provide new and improved expedients for applying bodies containing bonding material. It is also desirable to engage individual bodies which may be irregular in shape and to apply them to bonding sites without disturbing flux thereon. More particularly, it is advantageous to substantially simultaneously apply ones of bodies containing bonding material to each of an array of bonding sites.

SUMMARY OF THE INVENTION

The present invention includes a member for holding the bodies in an array corresponding to an array of bonding sites. A pickup head holds an array of pickup pins such that pickup ends thereof correspond to the array of bodies and sites. The pickup head is connected to a mechanism which manipulates the array of pins in steps, to substantially simultaneously engage each of the bodies in the member with a corresponding pickup end of a pin, to substantially simultaneously contact each of the bodies to a corresponding bonding site and to substantially simultaneously disengage the pins from the bodies.

In a preferred embodiment, the bodies contain solder which is readily conductive and frictionally engageable by pressure of the pins upon the bodies.

BRIEF DESCRIPTION OF THE DRAWINGS

The invention will be more readily understood from the following detailed description thereof when read in conjunction with the accompanying drawing, wherein.

Figure 1:
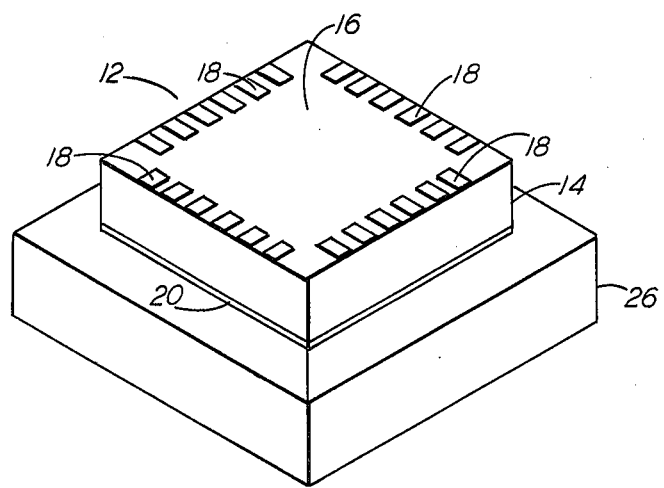
FIG. 1 is a pictorial view of a bonding stage supporting a chip carrier having an array of terminals to receive bonding material for service connection.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

ARRAYS OF BONDING SITES

Referring to FIG. 1, a typical chip carrier is seen designated generally by the numeral 12. Although carrier 12 will be utilized to illustrate the practice of the invention, it should be noted that the invention is not limited to such carriers. Other items in the semiconductor industry and other items in other industries contain arrays of bonding sites which are amenable to the practice of the invention.

Carrier 12 is adapted to enclose a semiconductor device (not shown) such as a monocrystalline silicon chip. Such chips are often about 150 mils square by about 20 mils in thickness and often contain a dense pattern of electronic devices and interconnecting circuitry. A package, such as carrier 12, advantageously protects such a chip from physical abuse and from external effects, such as corrosion.

Carrier 12 may have a plastic or ceramic body 14 which is about 400 to 500 mils square and about 100 mils high containing an internal cavity (not shown) for installing the chip therein. On a major external surface 16, an array of terminal pads 18 are typically formed of a conductive and corrosion-resistant metal such as gold. The pads 18 are often very small and densely arranged. For example, the pads 18 may be about 20 mils wide by about 50 mils long and be spaced about 50 mils on center. Although an array of 24 terminals are shown on carrier 12, there may be many more pads of smaller dimensions on a similar carrier. Such pads are connected internally to the circuitry of the chip, for example, by wire bonding.

After the chip is installed in carrier 12 and the internal connections are made to pads 18, the cavity is usually hermetically sealed, such as by fusing a cover 20 on the body 14. Thereafter, a problem remains to prepare the pads 18 for connection to leads or terminals on a ceramic substrate or a P-C board without damage to carrier 12 and its contents.

THE BODIES

One well-known method of adapting an array of bonding sites for connection is to apply boding material to each terminal after an item such as carrier 12 is completed and before it is installed. A body of bonding material is typically heat fused to a site and often such material is then sufficiently liquefied to flow onto and be fused to a major portion of each site, a technique referred to as "reflow." Thereafter, when an array of such sites are contacted to an array of service connections, the bonding material is again heated and sufficiently re-liquefied to wet and adhere to each respective contacting surface in each array.

Figure 2:
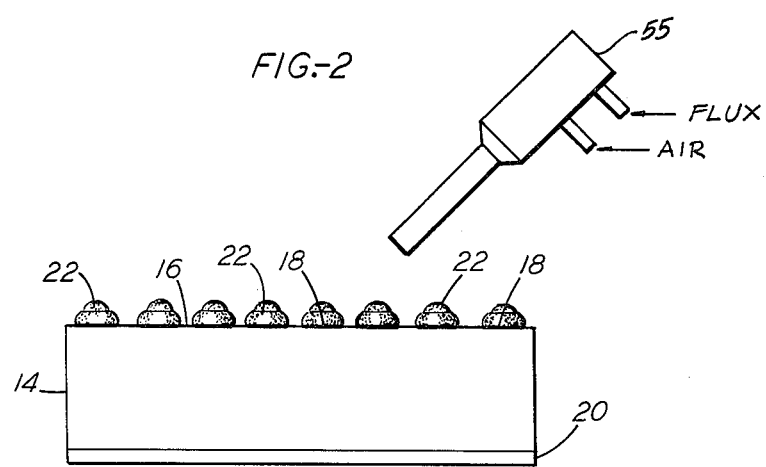
FIG. 2 is an elevation view of the chip carrier shown in FIG. 1 showing bodies of bonding material applied to terminals.

Referring to FIG. 2, an elevational view of a chip carrier 12 is seen after bodies 22 of bonding material have been applied to terminal pads 18. Such bodies 22 are typically performed quantities of bonding material such as, but not limited to, alloys of lead, tin and silver with slight amounts of antimony, bismuth or cadmium. The size and shape of bodies 22 are usually selected to suit the bonding sites, the expedients for manipulating the bodies and the cost of performing such bodies.

For a typical silicon I.C. chip and the carrier 12 described above, a 60/40 solder (60% tin-40% lead) is often selected as a bonding material. Such solder advantageously melts at about 183° C. but it will fuse to terminal pads 18 at a lower temperature under pressure applied from the bodies 22 to the pads 18. The temperature employed for fusing the bodies 22 can be applied in many ways as will be explained hereinafter. However, the temperature and pressure should be within a range which can be tolerated by carrier 12 and its contents.

The size of the bodies 22 shown in FIG. 2 was selected to accommodate the pads 18 and the mass of solder needed to fuse such pads to service connections. A spherical shape for bodies 22 was selected because spheres are readily oriented and they are economical to produce from a mass of solder material. Applying these considerations to the pads 18 of the size described above, spheres of 60/40 solder and about 35 to 40 mils in diameter were selected and applied for bodies 22 shown in FIG. 2.

As can be seen in FIG. 2, the bodies 22 are wider than the pads 18 and the spaces between the bodies are narrow in the condition shown. It can also be seen that the tools, heat and pressure utilized to engage and fuse the bodies 22 to the pads 18 have caused an annular indentation 24 on and a noticeable enlargement of each body 22. The heat for fusing may be applied to carrier 12 from a bonding stage 26, shown in FIG. 1. However, a heated enclosure is typically employed to later liquefy the solder sufficiently to have it flow over and fuse to a major portion of each site 18. One such heated enclosure employing a belt to advance chip carriers therethrough is sold by the Browne Corporation of Santa Barbara, California as its Browne LR-6. Such heating and redistribution of solder advantageously reduces the width of bodies 22 and enlarges each space therebetween. The distribution of solder also advantageously increases the adherence to sites 18 so bodies 22 are not readily dislodged during further handling.

PRIOR ART HEADS FOR MANIPULATING THE BODIES

Figure 3:
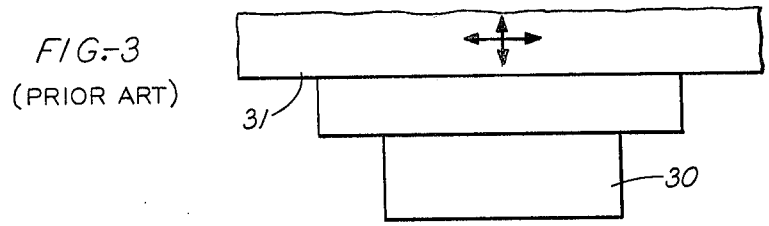
FIG. 3 is an elevation view of a prior art head for pickup of bodies containing bonding material.
Figure 4:
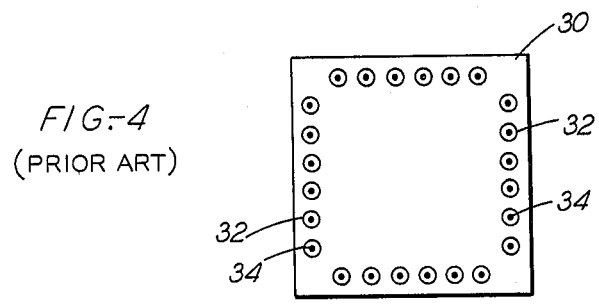
FIG. 4 is a bottom view of the head shown in FIG. 3 revealing prior art vacuum cups for pickup of spheres containing bonding material.

Referring to FIGS. 3 and 4, there are shown elevation and bottom views, respectively, of a head 30 for engaging bodies 22 in accordance with the prior art. Such heads 30 may be manipulated by any well-known mechanism 31, such as a modified Model 3000 bonder sold by Keller Technology Corporation of Buffalo, New York. Such a mechanism will move the head 30 to and from a source (not shown) of bodies 22 and the bonding sites 18 shown in FIGS. 1 and 2.

Head 30 includes an array of recesses 32 which generally correspond to the array of bonding sites 18. For grasping spherical bodies 22 it has been customary to form recesses 32 into hemispherical cups having a port 34 in each recess which communicates with a source of vacuum.

An unorganized mass of spherical bodies 22 were held in a reservoir and streams of air were released below the mass to cause the bodies to float in a fluidized manner. The head 30 was lowered within the reservoir and the bodies 22 were urged into the cups 32 by the air and the vacuum. A problem was that bodies 22 which were not of a regular spherical shape would not reliably seat in the cups 32. Another problem was that the vacuum drew flux off the bodies 22 or off the bonding sites 18.

In partial solution of the above problems, the head 30 was headed to about 160° C. to soften the bodies 22 and thereby encourage seating in the cups 32. Such seating also assisted in sealing off the vacuum ports 34 to minimize intake thereto of available bonding flux.

Using the technique described for head 30, bodies 22 of 60/40 solder were transferred from an unorganized mass in a reservoir to the sites 18 of a carrier 12. Such bodies 22 were initially fused to the sites 18 by approximately 50 psi pressure from the head 30 to the bodies and the sites. The stage 26 was heated to raise the temperature of carrier 12 and, therefore the pads 18, to about 180° C. Under these conditions the bodies 22 were fused to the pads 18 by a technique referred to as "thermocompression bonding." Later, in an effort to enhance adherence of the bodies 22 to the pads 18, the carriers 12 containing the bodies 22 were advanced through a heated enclosure to increase the temperature of the pads 18 above the melting point of the solder and thus reflow such bonding material over a major portion of each respective site.

While the above technique mitigated some of the problems in the prior art, another problem was encountered. When the head 30 was heated to seat the bodies 22 well into the cups 32, the head would not readily disengage from the carrier 12. The bodies 22 were often firmly engaged to the cups 32 by suction, heat and bonding pressure. Consequently, it was all too frequently necessary to inject a blast of air into the cups 32 to disengage them from the bodies 22 and to prevent a carrier 12 from being lifted off the stage 26 when head 30 was lifted therefrom.

NEW HEADS

Figure 5:
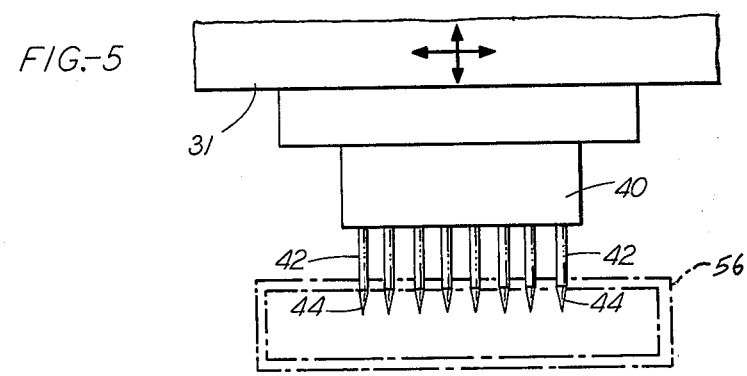
FIG. 5 is an elevation view of a pickup head holding pins for frictionally engaging bodies in accordance with the instant invention.
Figure 6:
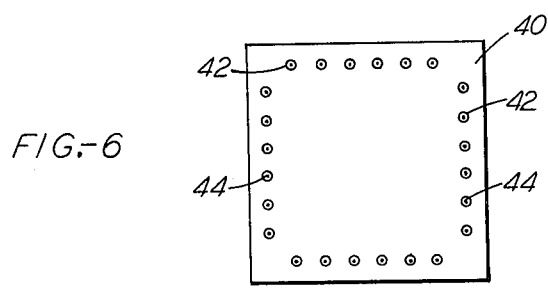
FIG. 6 is a bottom view of the head shown in FIG. 5.

Referring to FIGS. 5 and 6, there are seen elevation and bottom views, respectively, of a head 40 for engaging bodies 22 in accordance with the instant invention. Head 40 includes an array of pins 42 for picking up bodies 22 for bonding to the pads 18. The pins 42 are designed to frictionally engage the bodies 22 without a necessity for application of vacuum thereto. By frictionally engaging, it is meant that the pins 42 are pressed upon or into the bodies 22 so that friction is developed between the material of the bodies and surfaces of the pins. Such friction has been found to be adequate and preferable to vacuum, to engage and transfer the bodies 22 to the pads 18.

Figure 7:
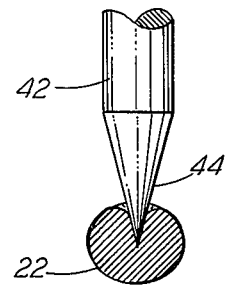
FIG. 7 is an elevation view, with a portion partially cutaway, of a pin having a sharp pickup end frictionally engaging a generally spherical body.

Referring to FIG. 7, there is seen a pin 42 with a particular pickup end 44, found to be advantageous in the practice of the invention. End 44 includes a configuration which could be described as a sharp end. By sharp, it is meant, inter alia, that end 44 could be pointed as a pencil is sharpened or it could be tapered as a screwdriver is tapered. The purpose of a sharp configuration for end 44 is to facilitate easy puncture of a body 22 so that frictional engagement is readily made as described previously.

Figure 8:
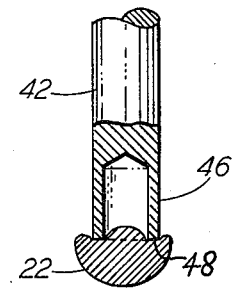
FIG. 8 is an elevation view, with a portion partially cutaway, of a pin having a tubular end for frictionally engaging a generally spherical body.

Referring to FIG. 8, there is seen a pin 42 with a hollow pickup end 46, also found to be advantageous in the practice of the invention. End 46 provides an extensive annular edge 48 to engage a body 22. Note that annular edge 48 can be a smooth ring which is easily pressed upon a body 22 in the manner shown. Even if the surface of the bonding material is not pierced, deformation is noted and a portion of material is pressed upward for frictional engagement within tubular end 46. On the other hand, the annular edge 48 may be sharpened or saw cut in a number of known ways to pierce the body 22 and cause material thereof to frictionally engage upon the surfaces of end 46.

The major portions of pins 42 may be either solid or tubular and fitted with ends 44, 46 or other configurations which provide frictional engagement with the bodies 22. For optimum operation it is preferable that pins 42 be made of a material such as stainless steel which is normally resistant to both ambient corrosion and fusion with most bonding materials. The fusion referred to herein is meant to include the action of soft solders on metal which is sometimes characterized as an inter-metallic solution action rather than an alloy or actual fashion of the respective metals.

Figure 9:
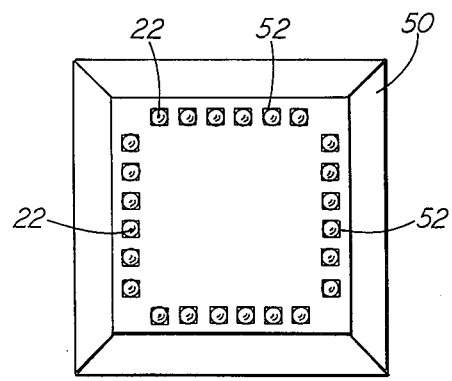
FIG. 9 is a plan view of a member holding an array of bodies for pickup by the head shown in FIG. 5.

Referring to FIG. 9 there is seen a member 50 for holding bodies of bonding material in an array corresponding to an array of bonding sites. Member 50 is shown for convenience with square recesses 52. However, the recesses 52 may be of any suitable configuration to accommodate bodies of a particular size and shape. The function of member 50 is to restrain the bodies in a specific location so each may be frictionally engaged by an end of a pin in a pickup head aligned above member 50.

It will be appreciated that the recesses 52 in member 50 are loaded with bodies 22 before a head 40 engages the bodies 22. Such loading may be done in a number of well-known ways for handling such bodies. A preferable method of loading member 50 is to simply immerse it and raise it in an air-agitated mass of a reservoir as was described with reference to the prior art. Another method is to advance a stream of bodies over the recesses 52 while the member 50 is ultrasonically agitated. In a more sophisticated method of loading, a sensor is located in each recess 52 in a member 50 and each sensor is electrically scanned to signal when all recesses are loaded.

For the array of pads 18 found on the carrier 12, the member 50 holds 24 such spherical bodies 22 in a symmetrical pattern in a substantially planar manner. For the same array, head 40 holds an array of pickup pins 42 such that pickup ends 44 or 46 thereof correspond to the arrays of bodies 22 in member 50 and the pads 18. Then head 40 and the array of pins 42 are manipulated in steps, to substantially simultaneously engage each of the bodies 22 with a corresponding pickup end of a pin 42, to substantially simultaneously contact each of the bodies 22 to a corresponding bonding site 18 and to substantially simultaneously disengage the pins 42 from the bodies 22.

By reference again to FIGS. 7 and 8, it can be seen that very little pressure is required to frictionally engage a pickup end 44 or 46 to a body 22. Although the pins 42 and the ends 44 or 46 may be heated, it is preferable in handling bodies of soft solder that such ends remain at about room temperature. Consequently, in one embodiment of the invention, the pins are cooled, such as by a water bath in a vessel FIG. 5, after they are withdrawn from the bodies 22 on the pads 18 and before they engage a next array of bodies.

It is customary in many bonding operations to utilize an oxide removing agent such as a soldering flux to clean the surfaces of metals to be joined. In the prior art such flux was normally applied to the bonding sites by manual dabbing or by a pneumatic dispenser 55 FIG. 2. A problem was previously noted that the vacuum cups 32 in head 30 tended to draw flux from the bodies 22 and the pads 18. However, according to the present invention, no vacuum is required to frictionally engage the bodies 22 with pickup pins 42. Consequently, there is more versatility in applying the flux in the work.

For example, the flux may be applied by merely dipping an array of bodies 22 into a supply of liquid flux (not shown) after such bodies are frictionally engaged by pins 42 and before the bodies are applied to the pads 18. Also, the pads can receive flux by a prior art method without fear of having the flux drawn away by vacuum cups 32.

In another embodiment, wherein tubular pins 42 are used with tubular ends 46, the flux may be conducted through pins 42 onto the bodies 22 or the pads 18. The flux may be drawn into the tubes prior to engaging the bodies 22 or it may be fed from a source (not shown) through head 40 into the pins 42 and onto the bodies 22 or the pads 18 or both.

In another embodiment flux paste may be applied directly to the bodies 22 or the pads 18 in an array utilizing pins 42 with ends 44 or 46 engaging a source of paste.

There have been illustrated herein certain embodiments of the invention and certain applications thereof. Nevertheless, it is to be understood that various modifications and refinements may be made and used which differ from these disclosed embodiments without departing from the spirit and scope of the present invention.

What is claimed is:

1. Apparatus for substantially simultaneously applying respective ones of bodies containing bonding material to each of an array of bonding sites comprising:
   means for holding the bodies in an array corresponding to the array of bonding sites;
   means for holding an array of pickup pins having pickup ends adapted to frictionally engage the bodies and such array having such pickup ends correspond to the arrays of bodies and sites; and means for manipulating the array of pins in steps, to substantially simultaneously, frictionally engage each of the bodies with a corresponding pickup end of a pin, to substantially simultaneously contact each of the bodies to a corresponding bonding site and to substantially simultaneously disengage the pins from the bodies.

2. Apparatus as in claim 1, wherein the bodies contain solder which is readily conductive and frictionally engageable by pressure of the pins upon the bodies and wherein the pins are made of a material which is normally resistant to both ambient corrosion and fusion with solder.

3. Apparatus as in claim 2, wherein the pins have sharp pickup ends.

4. Apparatus as in claim 2, wherein the pins are tubular at least at the pickup ends which are sufficiently large to be frictionally engageable with the bodies, yet sufficiently small to block the bodies from entering the tubular ends.

5. Apparatus as in claims 3 or 4, further comprising:
means for heating the bonding sites to adheringly fuse the bodies thereto such that the pins are readily disengaged therefrom.

6. Apparatus as in claim 5, further comprising:
means for applying flux to the bodies.

7. Apparatus as in claim 5, further comprising:
means for applying flux to the bonding sites.

8. Apparatus as in claim 1, further comprising:
means for cooling the pins after they are disengaged from the bodies on the sites and before they engage a next array of bodies.

9. A method of substantially simultaneously applying respective ones of bodies containing bonding material to each of an array of bonding sites, comprising:
holding the bodies in an array corresponding to the array of bonding sites;
holding an array of pickup pins having pickup ends adapted to frictionally engage the bodies and such array having such pickup ends correspond to the arrays of bodies and sites; and
manipulating the array of pins in steps, including:
substantially simultaneously, frictionally engaging each of the bodies with a corresponding pickup end of a pin, substantially simultaneously contacting each of the engaged bodies to a corresponding bonding site and substantially simultaneously disengaging the pins from the bodies.

10. A method as in claim 9, wherein the bodies contain solder which is readily conductive and wherein the manipulating further comprises:
frictionally engaging the pins upon the bodies by applying pressure from the pins to the bodies.

11. A method as in claim 10, further comprising the step of:
forming the pins of a material which is normally resistant to both ambient corrosion and fusion with solder.

12. A method as in claim 11, wherein the forming step further comprises:
forming sharp pickup ends on the pins.

13. A method as in claim 11, wherein the forming step further comprises:
forming the pins with tubular pickup ends which are sufficiently large to be frictionally engageable with the bodies yet sufficiently small to block the bodies from entering the tubular ends.

14. A method as in claims 12 or 13, further comprising:
heating the bonding sites to adheringly fuse the bodies thereto such that the pins are readily disengaged therefrom.

15. A method as in claim 14, further comprising:
applying flux to the bodies.

16. A method as in claim 14, further comprising:
applying flux to the bonding sites.

17. A method as in claim 9, further comprising:
cooling the pins after they are disengaged from the bodies on the sites and before they engage a next array of bodies.

* * * * *

UNITED STATES PATENT AND TRADEMARK OFFICE
CERTIFICATE OF CORRECTION

PATENT NO. : 4,421,266
DATED : December 20, 1983
INVENTOR(S) : A. B. Bock

It is certified that error appears in the above—identified patent and that said Letters Patent is hereby corrected as shown below:

In the specification, Column 3, line 26, "performed" should read --preformed--. Column 3, line 31, "performing" should read --preforming--. Column 4, line 32, "headed" should read --heated--. Column 5, line 43, "fashion" should read --fusion--. Column 5, line 65, "electrically" should read --electronically--. Column 6, line 19, after "vessel" insert --56--.

Signed and Sealed this

Twenty-fourth Day of April 1984

[SEAL]

Attest:

GERALD J. MOSSINGHOFF

Attesting Officer

Commissioner of Patents and Trademarks